United States Patent
Dong et al.

(10) Patent No.: US 11,631,362 B2
(45) Date of Patent: Apr. 18, 2023

(54) SHIFT REGISTER UNIT, GATE DRIVING CIRCUIT, DISPLAY PANEL AND METHOD FOR CONTROL THE SHIFT REGISTER UNIT

(71) Applicant: BOE Technology Group Co., Ltd., Beijing (CN)

(72) Inventors: Shuilang Dong, Beijing (CN); Shanshan Xu, Beijing (CN); Guangcai Yuan, Beijing (CN); Zhanfeng Cao, Beijing (CN); Ce Ning, Beijing (CN); Lizhong Wang, Beijing (CN); Dapeng Xue, Beijing (CN); Nianqi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/535,127

(22) Filed: Nov. 24, 2021

(65) Prior Publication Data

US 2022/0208070 A1   Jun. 30, 2022

(30) Foreign Application Priority Data

Dec. 24, 2020  (CN) .......................... 202011554684.1

(51) Int. Cl.
*G09G 3/3266* (2016.01)
*G09G 3/20* (2006.01)
*G11C 19/28* (2006.01)

(52) U.S. Cl.
CPC ... *G09G 3/2092* (2013.01); *G09G 2310/0286* (2013.01); *G09G 2310/061* (2013.01); *G09G 2310/08* (2013.01); *G11C 19/28* (2013.01)

(58) Field of Classification Search
CPC ......... G09G 3/2092; G09G 2310/0286; G09G 2310/061; G09G 2310/08; G09G 3/3677; G11C 19/28
See application file for complete search history.

(56) References Cited

U.S. PATENT DOCUMENTS

| | | | |
|---|---|---|---|
| 11,257,411 B2* | 2/2022 | Xue | G09G 3/20 |
| 2011/0199365 A1* | 8/2011 | Umezaki | H01L 29/7869 |
| | | | 345/212 |
| 2017/0270892 A1* | 9/2017 | Wang | G11C 19/28 |
| 2018/0329547 A1* | 11/2018 | Wu | G06F 3/0412 |
| 2018/0366067 A1* | 12/2018 | Jang | G09G 3/3266 |
| 2019/0214104 A1* | 7/2019 | Qian | G11C 19/28 |
| 2020/0135287 A1* | 4/2020 | Han | G09G 3/3677 |
| 2020/0168162 A1* | 5/2020 | Feng | G09G 3/3266 |
| 2021/0142712 A1* | 5/2021 | Wang | G09G 3/20 |

(Continued)

*Primary Examiner* — Jose R Soto Lopez
(74) *Attorney, Agent, or Firm* — IPro, PLLC

(57) ABSTRACT

A shift register unit includes an input sub-circuit, a pull-down node driving sub-circuit and an output sub-circuit. The pull-down node driving sub-circuit includes a first connection unit, a first voltage-reduction unit and a second connection unit, and configured to: under the control of the first voltage signal terminal and the pull-up node, transmit a first voltage signal from the first voltage signal terminal to the first pull-down node via the first connection unit, and reduce a voltage applied to the second connection unit via the first voltage-reduction unit; and transmit a second voltage signal from the second voltage signal terminal to the first pull-down node via the second connection unit under the control of the pull-up node.

18 Claims, 4 Drawing Sheets

(56) References Cited

U.S. PATENT DOCUMENTS

2021/0201804 A1* 7/2021 Feng .................... G09G 3/3266
2021/0225251 A1* 7/2021 Xu ....................... G09G 3/2092
2021/0390895 A1* 12/2021 Wang ................... G09G 3/3266

* cited by examiner

SHIFT REGISTER UNIT, GATE DRIVING CIRCUIT, DISPLAY PANEL AND METHOD FOR CONTROL THE SHIFT REGISTER UNIT

CROSS-REFERENCE TO RELATED APPLICATION

This application claims a priority to Chinese Patent Application No. 202011554684.1 filed on Dec. 24, 2020, which is incorporated in its entirety by reference herein.

TECHNICAL FIELD

The present disclosure relates to the field of display technology, in particular to a shift register unit, a gate driving circuit, a display panel and a method for controlling the shift register unit.

BACKGROUND

Along with the increasing requirement on display, Oxide thin film transistor (TFT) technology is gradually replacing a-Si TFT liquid crystal display (LCD) technology due to its high mobility. However, as compared with a-Si LCD, Oxide LCD is inferior in terms of stability and yield, which is continued to be optimized by major panel manufacturers. A large-size product such as an 8K 120 Hz Oxide product has a higher requirement on a driving voltage.

SUMMARY

In an aspect, a shift register unit is provided, including: an input sub-circuit, electrically connected to an input signal terminal and a pull-up node and configured to transmit an input signal from the input signal terminal to the pull-up node under the control of the input signal terminal; a pull-down node driving sub-circuit, electrically connected to a first voltage signal terminal, the pull-up node, a first pull-down node and a second voltage signal terminal, including a first connection unit, a first voltage-reduction unit and a second connection unit, and configured to: under the control of the first voltage signal terminal and the pull-up node, transmit a first voltage signal from the first voltage signal terminal to the first pull-down node via the first connection unit, and reduce a voltage applied to the second connection unit via the first voltage-reduction unit; and transmit a second voltage signal from the second voltage signal terminal to the first pull-down node via the second connection unit under the control of the pull-up node; and an output sub-circuit, electrically connected to the pull-up node, a clock signal terminal, the first pull-down node, the second voltage signal terminal and a first output signal terminal, and configured to transmit a clock signal from the clock signal terminal to the first output signal terminal under the control of the pull-up node, and transmit the second voltage signal from the second voltage signal terminal to the first output signal terminal under the control of the first pull-down node.

In some possible embodiments of the present disclosure, the first voltage-reduction unit is configured to share the first voltage signal with the second connection unit, to reduce the voltage applied to the second connection unit under the control of the first voltage signal terminal and the pull-up node; or the first voltage-reduction unit is configured to block the first voltage signal, to reduce the voltage applied to the second connection unit from the first voltage signal under the control of the first voltage signal terminal and the pull-up node.

In some possible embodiments of the present disclosure, the pull-down node driving sub-circuit is further electrically connected to a third voltage signal terminal and a second pull-down node, and further includes a third connection unit corresponding to the first connection unit, a second voltage-reduction unit corresponding to the first voltage-reduction unit and a fourth connection unit corresponding to the second connection unit. The pull-down node driving sub-circuit is configured to: under the control of the third voltage signal terminal and the pull-up node, transmit a third voltage signal from the third voltage signal terminal to the second pull-down node via the third connection unit, and reduce a voltage applied to the fourth connection unit via the second voltage-reduction unit, where the third voltage signal is of a phase reverse to the first voltage signal; and transmit the second voltage signal from the second voltage signal terminal to the second pull-down node via the fourth connection unit under the control of the pull-up node.

In some possible embodiments of the present disclosure, the pull-down node driving sub-circuit is further electrically connected to the input signal terminal. The pull-down node driving sub-circuit further includes a fifth connection unit corresponding to the second connection unit, and the pull-down node driving sub-circuit further includes a sixth connection unit corresponding to the fourth connection unit. The pull-down node driving sub-circuit is configured to transmit the second voltage signal from the second voltage signal terminal to the first pull-down node via the fifth connection unit under the control of the input signal terminal, and transmit the second voltage signal from the second voltage signal terminal to the second pull-down node via the sixth connection unit under the control of the input signal terminal.

In some possible embodiments of the present disclosure, the pull-down node driving sub-circuit includes a second transistor as the first connection unit, a third transistor as the first voltage-reduction unit and a fourth transistor as the second connection unit. A gate electrode and a first electrode of the second transistor are electrically connected to the first voltage signal terminal, and a second electrode of the second transistor is electrically connected to the first pull-down node. A gate electrode of the third transistor is electrically connected to the first voltage signal terminal, a first electrode of the third transistor is electrically connected to the first pull-down node, and a second electrode of the third transistor is electrically connected to a first electrode of the fourth transistor. Or, a gate electrode of the third transistor is electrically connected to the pull-up node, a first electrode of the third transistor is electrically connected to the first pull-down node, and a second electrode of the third transistor is electrically connected to a first electrode of the fourth transistor. A gate electrode of the fourth transistor is electrically connected to the pull-up node, and a second electrode of the fourth transistor is electrically connected to the second voltage signal terminal.

In some possible embodiments of the present disclosure, in the case that the gate electrode of the third transistor is electrically connected to the first voltage signal terminal, the first electrode of the third transistor is electrically connected to the first pull-down node, and the second electrode of the third transistor is electrically connected to the first electrode of the fourth transistor is electrically connected, a ratio of a width of a channel of the fourth transistor to a width of a channel of the second transistor is greater than 7:1, and a ratio of a width of a channel of the third transistor to the width of the channel of the second transistor is greater than 20:1. A ratio of the width of the channel of the second transistor to the width of the channel of the third transistor to the width of the channel of the fourth transistor is 1:(19-21):(5-7).

In some possible embodiments of the present disclosure, in the case that the gate electrode of the third transistor is electrically connected to the pull-up node, the first electrode of the third transistor is electrically connected to the first pull-down node, and the second electrode of the third transistor is electrically connected to the first electrode of the fourth transistor, a ratio of a width of a channel of the third transistor to a width of a channel of the fourth transistor is greater than 10:1.

In some possible embodiments of the present disclosure, the pull-down node driving sub-circuit includes a twelfth transistor as the third connection unit, a thirteenth transistor as the second voltage-reduction unit, and a fourteenth transistor as the fourth connection unit. A gate electrode and a first electrode of the twelfth transistor are electrically connected to the third voltage signal terminal, and a second electrode of the twelfth transistor is electrically connected to the second pull-down node. A gate electrode of the thirteenth transistor is electrically connected to the third voltage signal terminal, a first electrode of the thirteenth transistor is electrically connected to the second pull-down node, and a second electrode of the thirteenth transistor is electrically connected to a first electrode of the fourteenth transistor. Or, a gate electrode of the thirteenth transistor is electrically connected to the pull-up node, a first electrode of the thirteenth transistor is electrically connected to the second pull-down node, and a second electrode of the thirteenth transistor is electrically connected to a first electrode of the fourteenth transistor. A gate electrode of the fourteenth transistor is electrically connected to the pull-up node, and a second electrode of the fourteenth transistor is electrically connected to the second voltage signal terminal.

In some possible embodiments of the present disclosure, in the case that the gate electrode of the thirteenth transistor is electrically connected to the third voltage signal terminal, the first electrode of the thirteenth transistor is electrically connected to the second pull-down node, and the second electrode of the thirteenth transistor is electrically connected to the first electrode of the fourteenth transistor, a ratio of a width of a channel of the fourteen transistor to a width of a channel of the twelfth transistor is greater than 7:1, and a ratio of a width of a channel of the thirteen transistor to the width of the channel of the twelfth transistor is greater than 20:1. A ratio of the width of the channel of the twelfth transistor to the width of the channel of the thirteen transistor to the width of the channel of the fourteen transistor is 1:(19-21):(5-7).

In some possible embodiments of the present disclosure, in the case that the gate electrode of the thirteenth transistor is electrically connected to the pull-up node, the first electrode of the thirteenth transistor is electrically connected to the second pull-down node, and the second electrode of the thirteenth transistor is electrically connected to the first electrode of the fourteenth transistor, a ratio of a width of a channel of the thirteenth transistor to a width of a channel of the fourteenth transistor is greater than 10:1.

In some possible embodiments of the present disclosure, the pull-down node driving sub-circuit further includes an eighteenth transistor and a nineteenth transistor. A gate electrode of the eighteenth transistor is electrically connected to the input signal terminal, a first electrode of the eighteenth transistor is electrically connected to the second electrode of the third transistor, and a second electrode of the eighteenth transistor is electrically connected to the second voltage signal terminal. A gate electrode of the nineteenth transistor is electrically connected to the input signal terminal, a first electrode of the nineteenth transistor is electrically connected to the second electrode of the thirteenth transistor, and a second electrode of the nineteenth transistor is electrically connected to the second voltage signal terminal.

In some possible embodiments of the present disclosure, the shift register unit further includes: a noise-reduction sub-circuit, electrically connected to the pull-up node, the second voltage signal terminal and the first pull-down node, and configured to transmit the second voltage signal from the second voltage signal terminal to the pull-up node under the control of the first pull-down node; and a first resetting sub-circuit, electrically connected to the pull-up node, a first resetting signal terminal and the second voltage signal terminal, and configured to transmit the second voltage signal from the second voltage signal terminal to the pull-up node under the control of the first resetting signal terminal.

In some possible embodiments of the present disclosure, the shift register unit further includes a cascade sub-circuit, electrically connected to the pull-up node, the clock signal terminal, the first pull-down node, the second voltage signal terminal and a second output signal terminal, and configured to transmit a clock signal from the clock signal terminal to the second output signal terminal under the control of the pull-up node, and transmit the second voltage signal from the second voltage signal terminal to the second output signal terminal under the control of the first pull-down node. The shift register unit further includes a second resetting sub-circuit, electrically connected to a second resetting signal terminal, the pull-up node and the second voltage signal terminal, and configured to transmit the second voltage signal from the second voltage signal terminal to the pull-up node under the control of the second resetting signal terminal.

In some possible embodiments of the present disclosure, the noise-reduction sub-circuit is further electrically connected to the second pull-down node, and further configured to transmit the second voltage signal from the second voltage signal terminal to the pull-up node under the control of the second pull-down node. The output sub-circuit is further electrically connected to the second pull-down node, and further configured to transmit the second voltage signal from the second voltage signal terminal to the first output signal terminal under the control of the second pull-down node. The cascade sub-circuit is further electrically connected to the second pull-down node, and further configured to transmit the second voltage signal from the second voltage signal terminal to the second output signal terminal under the control of the second pull-down node.

In some possible embodiments of the present disclosure, the input sub-circuit includes a first transistor, a gate electrode and a first electrode of the first transistor are electrically connected to the input signal terminal, and a second electrode of the first transistor is electrically connected to the pull-up node. The noise reduction sub-circuit includes a fifth transistor, a gate electrode of the fifth transistor is electrically connected to the first pull-down node, a first electrode of the fifth transistor is electrically connected to the pull-up node, and a second electrode of the fifth transistor is electrically connected to the second voltage signal terminal. The output sub-circuit includes a sixth transistor, a seventh transistor and a capacitor, a gate electrode of the sixth transistor is electrically connected to the pull-up node, a first electrode of the sixth transistor is electrically connected to the clock signal terminal, and a second electrode of the sixth transistor is electrically connected to the first output signal terminal. A gate electrode of the seventh transistor is electrically connected to the first pull-down node, a first electrode of the seventh transistor is electrically connected to the first output signal terminal, and a second electrode of the seventh transistor is electrically connected to the second voltage signal terminal. One terminal of the capacitor is electrically connected to the gate electrode of the sixth transistor, and the other terminal of the capacitor is electrically connected to the second electrode of the sixth transistor. The first resetting sub-circuit includes an eighth transistor, a gate electrode of the eighth transistor is electrically connected to the first resetting signal terminal, a first electrode of the eighth transistor is electrically connected to the pull-up node, and a second electrode of the eighth transistor is electrically connected to the second voltage signal terminal.

In some possible embodiments of the present disclosure, the cascade sub-circuit includes a ninth transistor and a tenth transistor, a gate electrode of the ninth transistor is electrically connected to the pull-up node, a first electrode of the ninth transistor is electrically connected to the clock signal terminal, and a second electrode of the ninth transistor is electrically connected to the second output signal terminal; a gate electrode of the tenth transistor is electrically connected to the first pull-down node, a first electrode of the tenth transistor is electrically connected to the second output signal terminal, and a second electrode of the tenth transistor is electrically connected to the second voltage signal terminal. The second resetting sub-circuit includes an eleventh transistor, a gate electrode of the eleventh transistor is electrically connected to the second resetting signal terminal, a first electrode of the eleventh transistor is electrically connected to the pull-up node, and a second electrode of the eleventh transistor is electrically connected to the second voltage signal terminal.

In some possible embodiments of the present disclosure, the noise reduction sub-circuit further includes a fifteenth transistor, a gate electrode of the fifteenth transistor is electrically connected to the second pull-down node, a first electrode of the fifteenth transistor is electrically connected to the pull-up node, and a second electrode of the fifteenth transistor is electrically connected to the second voltage signal terminal. The output sub-circuit includes a sixteenth transistor, a gate electrode of the sixteenth transistor is electrically connected to the second pull-down node, a first electrode of the sixteenth transistor is electrically connected to the first output signal terminal, and a second electrode of the sixteenth transistor is electrically connected to the second voltage signal terminal. The cascade sub-circuit includes a seventeenth transistor, a gate electrode of the seventeenth transistor is electrically connected to the second pull-down node, a first electrode of the seventeenth transistor is electrically connected to the second output signal terminal, and a second electrode of the seventeenth transistor is electrically connected to the second voltage signal terminal.

In another aspect, a gate driving circuit is further provided, including N cascaded shift register units as described above, where N is a natural number greater than 2. An input signal terminal of an $n^{th}$-level shift register unit is electrically connected to a first output signal terminal or a second output signal terminal of an $(n-1)^{th}$-level shift register unit, and a first output signal terminal or a second output signal terminal of an $(n+1)^{th}$-level shift register unit is electrically connected to a first resetting signal terminal of the $n^{th}$-level shift register unit, where n is greater than or equal to 1 and less than or equal to N. In the case that n is equal to 1, an input signal terminal of a first-level shift register unit is electrically connected to an ON signal of the gate driving circuit. In the case that n is equal to N, a first resetting signal terminal of a last-level shift register unit is electrically connected to a first resetting signal of the gate driving circuit.

In another aspect, a display panel is further provided, including the above-mentioned gate driving circuit.

In another aspect, a method for controlling the shift register unit is further provided, including: at a first stage, applying a high level to the input signal terminal as an input signal, and transmitting, by the input sub-circuit, the input signal to the pull-up node, to pull up a potential of the pull-up node; pulling down, by the pull-down node driving sub-circuit, a potential of the first pull-down node under the control of the pull-up node; at a second stage, transmitting, by the output sub-circuit, a clock signal from the clock signal terminal to the first output signal terminal under the control of the pull-up node; and at a third stage, under the control of the first voltage signal terminal and the pull-up node, pulling up, by the pull-down node driving sub-circuit, the potential of the first pull-down node, and reducing a voltage applied to the second connection unit via the first voltage-reduction unit; and transmitting, by the output sub-circuit, a second voltage signal from the second voltage signal terminal to the first output signal terminal under the control of the first pull-down node.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Obviously, the following drawings merely relate to some embodiments of the present disclosure, and based on these drawings, a person of ordinary skill in the art may obtain other drawings without any creative effort.

DETAILED DESCRIPTION

Figure 1:
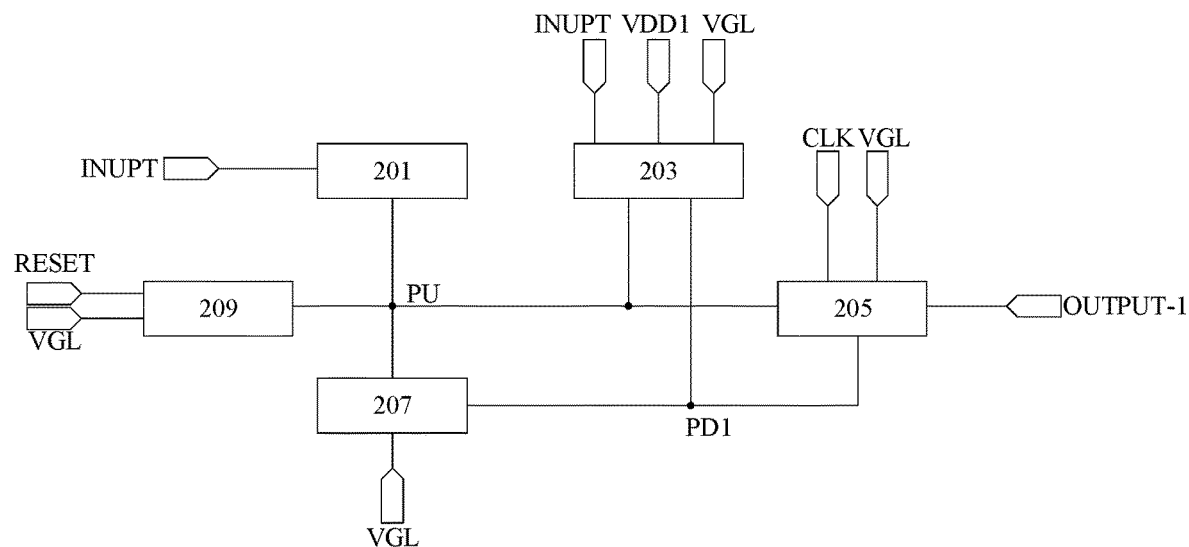
FIG. 1 is a schematic circuit diagram of a shift register unit according to some embodiments of the present disclosure.

The present disclosure will be described hereinafter in conjunction with the drawings and embodiments. Similar elements in the drawings are denoted by the same reference numerals. The following embodiments are for illustrative purposes only, but shall not be used to limit the scope of the present disclosure.

A high-end TV product is driven through a Gatedriver On Array (GOA) manner, so as to provide narrow-bezel display and reduce costs. In order to reduce the gate signal attenuation and delay caused by the large size and high resolution, a large driving voltage is required. Generally, a high level in the GOA manner is above 30V, and a low level is below −10V. The driving voltage is larger in a large-size product of 8 k and 120 Hz. For an IGZO TFT, a hot-carriers injection effect occurs easily due to excessive Vds, leading to a decreased drain current and TFT failure.

In the embodiments of the present disclosure, each transistor may be a thin film transistor (TFT), a field effect transistor (FET), or any other element having a same characteristic. Since a source electrode and a drain electrode of each transistor are symmetrical, and they are the same. In order to differentiate two electrodes of the transistor from each other, one of the two electrodes is called as a first electrode, the other is called as a second electrode, and a gate electrode is called as a control electrode. In addition, transistors may be divided into N-type transistors and P-type transistors according to their characteristics. In the following embodiments, N-type transistors are used for description. In this case, a first electrode of each N-type transistor is a drain electrode of the N-type transistor, and a second electrode is a source electrode of the N-type transistor. In the case that a high level is applied to a gate electrode of the N-type transistor, source and drain electrodes of the N-type transistor are electrically connected to each other. On the contrary, when a low level is applied to a gate electrode of each P-type transistor, source and drain electrodes of each P-type transistor are electrically connected to each other. It should be appreciated that, a person skilled in the art may, without any creative effort, obtain the implementation of P-type transistor, which also fall within the scope of the present disclosure.

A shift register unit is provided in some embodiments of the present disclosure, including: an input sub-circuit, electrically connected to an input signal terminal and a pull-up node and configured to transmit an input signal from the input signal terminal to the pull-up node under the control of the input signal terminal; a pull-down node driving sub-circuit, electrically connected to a first voltage signal terminal, the pull-up node, a first pull-down node and a second voltage signal terminal, including a first connection unit, a first voltage-reduction unit and a second connection unit, and configured to: under the control of the first voltage signal terminal and the pull-up node, transmit a first voltage signal from the first voltage signal terminal to the first pull-down node via the first connection unit, and reduce a voltage applied to the second connection unit via the first voltage-reduction unit; and transmit a second voltage signal from the second voltage signal terminal to the first pull-down node via the second connection unit under the control of the pull-up node; and an output sub-circuit, electrically connected to the pull-up node, a clock signal terminal, the first pull-down node, the second voltage signal terminal and a first output signal terminal and configured to transmit a clock signal from the clock signal terminal to the first output signal terminal under the control of the pull-up node, and transmit the second voltage signal from the second voltage signal terminal to the first output signal terminal under the control of the first pull-down node.

Usually, a pull-down node PD is connected to the first voltage signal terminal (e.g., VDD) via the first connection unit, and in a high-level state for a long time. A transistor in the second connection unit is exposed to a long-term and large Vds (Drain electrode: PD, Source electrode: LVGL), so it fails easily. However, it requires an additional level-conversion circuit to reduce a voltage from VDD, and control the voltage from VDD separately, which will increase the cost. In addition, in the case that the voltage from VDD decreases, a voltage at the pull-down node PD decreases, which may reduce the noise reduction capability, thereby to adversely affect the reliability of the circuit and the normal display and driving.

In the embodiments, a voltage-reduction unit is provided in the pull-down node driving sub-circuit, so as to reduce the voltage applied to the second connection unit, thereby reducing a source-to-drain voltage of a transistor in the second connection unit, and avoiding the attenuation failure of the transistor. As a result, it is able to effectively improve the circuit stability of the shift register unit, thereby improving the circuit stability of the GOA manner, and provide a wide application prospect.

In some embodiments, the shift register unit further includes: a noise-reduction sub-circuit, electrically connected to the pull-up node, the second voltage signal terminal and the first pull-down node, and configured to transmit the second voltage signal from the second voltage signal terminal to the pull-up node under the control of the first pull-down node; and a first resetting sub-circuit, electrically connected to the pull-up node, a first resetting signal terminal and the second voltage signal terminal, and configured to transmit the second voltage signal from the second voltage signal terminal to the pull-up node under the control of the first resetting signal terminal.

Figure 2:
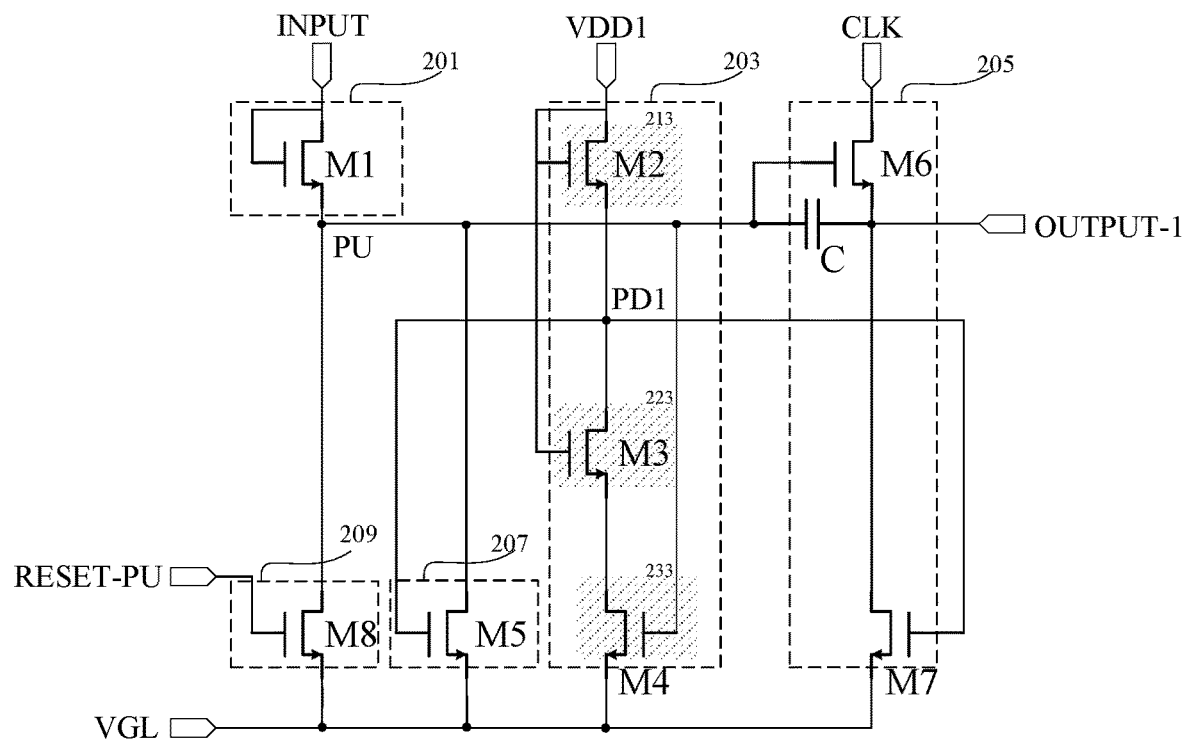
FIG. 2 is a schematic circuit diagram of the shift register unit according to some embodiments of the present disclosure.

In a specific embodiment, as shown in FIGS. 1 and 2, the shift register unit includes an input sub-circuit 201, a pull-down node driving sub-circuit 203, an output sub-circuit 205, a noise-reduction sub-circuit 207 and a first resetting sub-circuit 209.

The input sub-circuit 201 is electrically connected to an input signal terminal INPUT and a pull-up node PU and configured to transmit an input signal from the input signal terminal INPUT to the pull-up node PU under the control of the input signal terminal INPUT. When the input signal is a high level, the input sub-circuit 201 is configured to transmit the high level to the pull-up node PU, so as to charge the pull-up node PU.

Specifically, the input sub-circuit 201 includes a first transistor M1, a gate electrode and a first electrode of the first transistor are electrically connected to the input signal terminal INPUT, and a second electrode of the first transistor is electrically connected to the pull-up node PU.

The pull-down node driving sub-circuit 203 is electrically connected to a first voltage signal terminal VDD1, the pull-up node PU, a first pull-down node PD1 and a second voltage signal terminal VGL. The pull-down node driving sub-circuit includes a first connection unit 213, a first voltage-reduction unit 223 and a second connection unit 233, and configured to: under the control of the first voltage signal terminal VDD1 and the pull-up node PU, transmit a first voltage signal from the first voltage signal terminal VDD1 to the first pull-down node PD1 via the first connection unit 213, and reduce a voltage applied to the second connection unit 233 via the first voltage-reduction unit 223; and transmit a second voltage signal from the second voltage signal terminal VGL to the first pull-down node PD1 via the second connection unit under the control of the pull-up node PU. Illustratively, the second voltage signal is a low-level signal.

Figure 3:
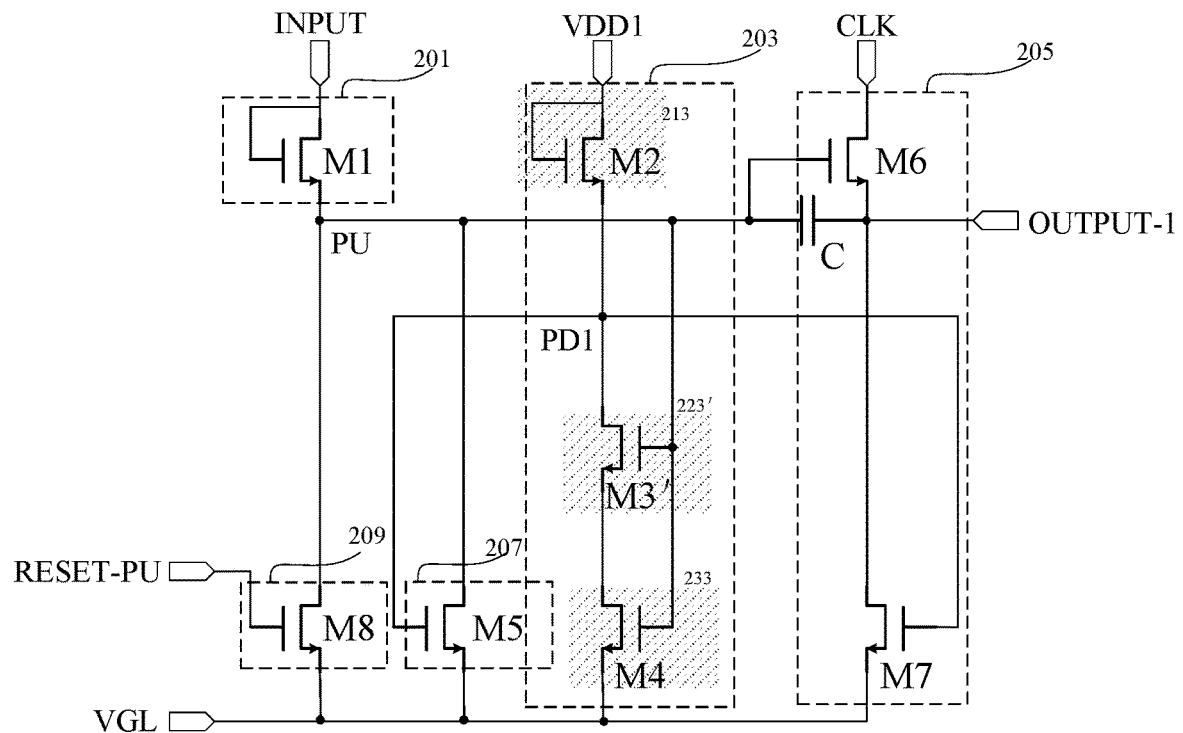
FIG. 3 is a schematic circuit diagram of the shift register unit according to some embodiments of the present disclosure.

Optionally, as shown in FIGS. 2 and 3, the first voltage-reduction unit 223 in the pull-down node driving sub-circuit 203 is configured to share the first voltage signal with the second connection unit 233, to reduce the voltage applied to the second connection unit 233 under the control of the first voltage signal terminal VDD1 and the pull-up node PU. Through the above scheme, the first voltage signal input from the first voltage signal terminal VDD1 is applied to the first voltage-reduction unit 223 and the second connection unit 233 after the first connection unit 213, so it is able to realize a voltage division of the second connection unit 233 via the first voltage-reduction unit 223, that is, part of the voltage applied to the second connection unit 233 is applied to the first voltage-reduction unit 223, thereby reducing the voltage applied to the second connection unit 233. As a result, it is able to avoid the attenuation failure of the transistor in the second connection unit 233 due to being exposed to a long-term and large voltage, thereby to effectively improve the circuit stability of the shift register unit.

Specifically, as shown in FIG. 2, the first connection unit 213 is a second transistor M2, the first voltage-reduction unit 223 is a third transistor M3, and the second connection unit 233 is a fourth transistor M4. A gate electrode and a first electrode of the second transistor M2 are electrically connected to the first voltage signal terminal VDD1, and a second electrode of the second transistor M2 is electrically connected to the first pull-down node PD1. A gate electrode of the third transistor M3 is electrically connected to the first voltage signal terminal VDD1, a first electrode of the third transistor M3 is electrically connected to the first pull-down node PD1, and a second electrode of the third transistor M3 is electrically connected to a first electrode of the fourth transistor M4. A gate electrode of the fourth transistor M4 is electrically connected to the pull-up node PU, and a second electrode of the fourth transistor M4 is electrically connected to the second voltage signal terminal VGL.

As can be appreciated by those skilled in the art, the larger a size of the transistor in the second connection unit 233, the better its withstand-voltage performance of drain and source electrodes. That is, the larger a size (such as a width of a channel) of the fourth transistor M4, the better the withstand-voltage performance of drain and source electrodes of M4. In the embodiment shown in FIG. 2, since the first voltage-reduction unit 223 is used to reduce the voltage applied to the second connection unit 233 through the voltage division, the larger a size (such as a width of a channel) of the third transistor M3 in the first voltage-reduction unit, the more apparent the voltage-division effect, and the better the effect of reducing the voltage applied to the fourth transistor M4 in the second connection unit 233. In some embodiments, a ratio of a width of a channel of the fourth transistor M4 to a width of a channel of the second transistor M2 is greater than 7:1, and a ratio of a width of a channel of the third transistor M3 to the width of the channel of the second transistor M2 is greater than 20:1. In some embodiments, a ratio of the width of the channel of the second transistor M2 to the width of the channel of the third transistor M3 to the width of the channel of the fourth transistor M4 is 1:(19-21):(5-7). Optionally, a ratio of the width of the channel of the second transistor M2 to the width of the channel of the third transistor M3 to the width of the channel of the fourth transistor M4 is 1:20:7, so as to ensure a low level amplitude of the first pull-down node PD1.

Optionally, as shown in FIG. 3, the first voltage-reduction unit 223' in the pull-down node driving sub-circuit 203 is configured to block the first voltage signal, to reduce the voltage applied to the second connection unit from the first voltage signal under the control of the first voltage signal terminal VDD1 and the pull-up node PU. Through the above scheme, although the first voltage signal of the first voltage signal terminal VDD1 is always transmitted to the first pull-down node PD1 via the first connection unit 213, as long as the pull-up node PU is at a low level, the first voltage-reduction unit 223' is in an open-circuit state, so it is able to block the first voltage signal through an open-circuit manner, thereby to avoid the attenuation failure of the transistor in the second connection unit 233 due to being exposed to a long-term and large voltage, thereby to effectively improve the circuit stability of the shift register unit.

Specifically, as shown in FIG. 3, structures of the first connection unit 213 and the second connection unit 233 are the same as those in FIG. 2, and will not be repeated herein. The first voltage-reduction unit 223' in the pull-down node driving sub-circuit 203 is a third transistor M3', a gate electrode of the third transistor M3' is electrically connected to the pull-up node PU, a first electrode of the third transistor M3' is electrically connected to the first pull-down node PD1, and a second electrode of the third transistor M3' is electrically connected to the first electrode of the fourth transistor M4.

As can be appreciated by those skilled in the art, in the embodiment shown in FIG. 3, when the pull-up node PU is at a low level, both the third transistor M3' in the first voltage-reduction unit 223' and the fourth transistor M4 in the second connection unit 233 are turned off. The first electrode of the fourth transistor M4 is in a floating state, thereby reducing a source-to-drain voltage of the fourth transistor M4. Optionally, in order to ensure the low level amplitude of the first pull-down node PD1, a ratio of a width of a channel of the third transistor M3' to a width of a channel of the fourth transistor M4 is greater than 10:1.

The output sub-circuit 205 is electrically connected to the pull-up node PU, a clock signal terminal CLK, the first pull-down node PD1, the second voltage signal terminal VGL and a first output signal terminal OUTPUT-1, and configured to transmit a clock signal from the clock signal terminal CLK to the first output signal terminal OUTPUT-1 under the control of the pull-up node PU, and transmit the second voltage signal from the second voltage signal terminal VGL to the first output signal terminal OUTPUT-1 under the control of the first pull-down node PD1. Illustratively, the second voltage signal is a low-level signal.

Specifically, as shown in FIGS. 2 and 3, the output sub-circuit 205 includes a sixth transistor M6, a seventh transistor M7 and a capacitor C, a gate electrode of the sixth transistor M6 is electrically connected to the pull-up node, a first electrode of the sixth transistor M6 is electrically connected to the clock signal terminal CLK, and a second electrode of the sixth transistor M6 is electrically connected to the first output signal terminal OUTPUT-1. A gate electrode of the seventh transistor M7 is electrically connected to the first pull-down node PD1, a first electrode of the seventh transistor M7 is electrically connected to the first output signal terminal OUTPUT-1, and a second electrode of the seventh transistor M7 is electrically connected to the second voltage signal terminal VGL. One terminal of the capacitor C is electrically connected to the gate electrode of the sixth transistor M6, and the other terminal of the capacitor C is electrically connected to the second electrode of the sixth transistor M6. The one terminal of the capacitor C electrically connected to the gate electrode of the sixth transistor M6 is electrically connected to the pull-up node PU as well.

As can be appreciated by those skilled in the art, although FIG. 2 shows a case where a low-level signal is further inputted into the output sub-circuit 205 via the second voltage signal terminal VGL, which is for illustrative purpose only. According to needs of layout and wiring of a specific circuit, the low-level signal may also be applied through an additional port, which will not be particularly defined herein.

Through the above scheme, when the pull-up node PU is at a high level, to charge the capacitor C, and the capacitor C is further charged under the effect of a high-level signal at the clock signal terminal, so as to further increase the potential of the pull-up node PU. The sixth transistor M6 is turned on under the effect of the pull-up node PU, so as to output the clock signal from the clock signal terminal CLK through the first output terminal OUTPUT-1. In the case that the clock signal terminal CLK receives a high-level signal, the first output terminal OUTPUT-1 outputs a high level.

The noise-reduction sub-circuit 207 is electrically connected to the pull-up node PU, the second voltage signal terminal VGL and the first pull-down node PD1, and configured to transmit the second voltage signal from the second voltage signal terminal VGL to the pull-up node PU under the control of the first pull-down node PD1. Hence, it is able to pull down the potential of the first pull-down node PD1.

Specifically, as shown in FIGS. 2 and 3, the noise reduction sub-circuit includes a fifth transistor M5, a gate electrode of the fifth transistor M5 is electrically connected to the first pull-down node PD1, a first electrode of the fifth transistor M5 is electrically connected to the pull-up node PU, and a second electrode of the fifth transistor M5 is electrically connected to the second voltage signal terminal VGL.

A first resetting sub-circuit 209 is electrically connected to the pull-up node PU, a first resetting signal terminal RESET-PU and the second voltage signal terminal VGL, and configured to transmit the second voltage signal from the second voltage signal terminal VGL to the pull-up node PU under the control of the first resetting signal terminal RESET-PU. As a result, it is able to reset the pull-up node PU by pulling down the potential of the pull-up node PU.

Specifically, as shown in FIGS. 2 and 3, the first resetting sub-circuit 209 includes an eighth transistor M8, a gate electrode of the eighth transistor M8 is electrically connected to the first resetting signal terminal RESET-PU, a first electrode of the eighth transistor M8 is electrically connected to the pull-up node PU, and a second electrode of the eighth transistor M8 is electrically connected to the second voltage signal terminal VGL. When a high level is applied to the first resetting signal terminal RESET-PU and the pull-up node PU is at a high level, the potential of the pull-up node PU is pulled down under control of a resetting signal from the first resetting signal terminal RESET-PU.

Figure 4:
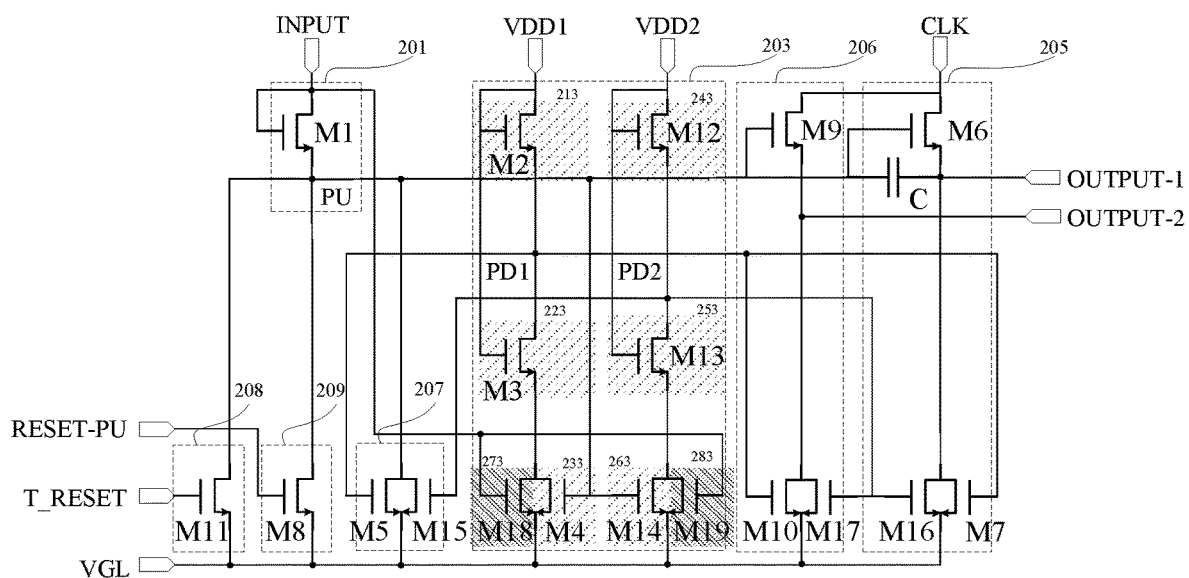
FIG. 4 is a schematic circuit diagram of the shift register unit according to some embodiments of the present disclosure.
Figure 5:
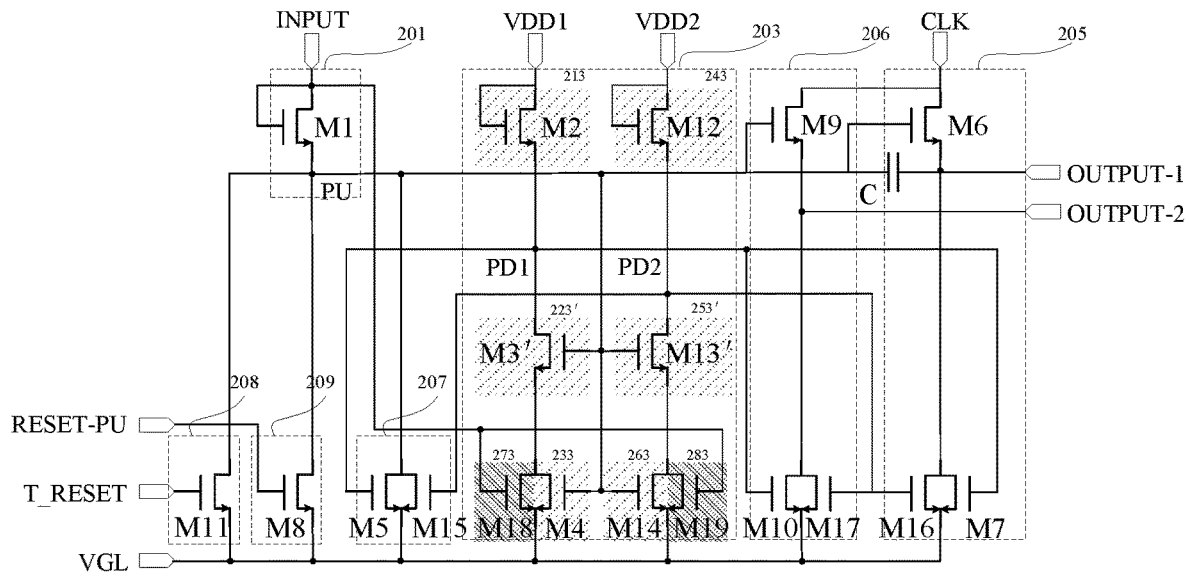
FIG. 5 is a schematic circuit diagram of the shift register unit according to some embodiments of the present disclosure.

In some optional embodiments, as shown in FIGS. 4 and 5, the shift register unit further includes a cascade sub-circuit 206, electrically connected to the pull-up node PU, the clock signal terminal CLK, the first pull-down node PD1, the second voltage signal terminal VGL and a second output signal terminal OUTPUT-2, and configured to transmit a clock signal from the clock signal terminal CLK to the second output signal terminal OUTPUT-2 under the control of the pull-up node PU, and transmit the second voltage signal from the second voltage signal terminal VGL to the second output signal terminal OUTPUT-2 under the control of the first pull-down node PD1.

Specifically, the cascade sub-circuit includes a ninth transistor M9 and a tenth transistor M10, a gate electrode of the ninth transistor M9 is electrically connected to the pull-up node PU, a first electrode of the ninth transistor M9 is electrically connected to the clock signal terminal CLK, and a second electrode of the ninth transistor M9 is electrically connected to the second output signal terminal OUTPUT-2. A gate electrode of the tenth transistor M10 is electrically connected to the first pull-down node PD1, a first electrode of the tenth transistor M10 is electrically connected to the second output signal terminal OUTPUT-2, and a second electrode of the tenth transistor M10 is electrically connected to the second voltage signal terminal VGL.

As shown in FIGS. 4 and 5, when setting the cascade sub-circuit 206, it is able to form a same output structure as the output sub-circuit 205 through the ninth transistor M9 and the capacitor C, so that the second output signal terminal OUTPUT-2 may be used as a cascading terminal of the shift register unit. Hence, it is able to realize the cascading of multiple shift register units through the cascade sub-circuit 206, and ensure the accuracy and stability of signals transmitted to a previous-level shift register unit and a next-level shift register unit. In addition, when the tenth transistor M10 is electrically connected to the second voltage signal terminal VGL, it is further able to provide a noise reduction function for the output terminal.

In some optional embodiments, as shown in FIGS. 4 and 5, the shift register unit further includes a second resetting sub-circuit 208, electrically connected to a second resetting signal terminal T_RESET, the pull-up node PU and the second voltage signal terminal VGL, and configured to transmit the second voltage signal from the second voltage signal terminal VGL to the pull-up node PU under the control of the second resetting signal terminal T_RESET. Hence, it is able to reset the pull-up node PU by pulling down the potential of the pull-up node PU. When the shift register units are cascaded, it is able to achieve a global resetting function of a cascaded circuit via the second resetting sub-circuit 208.

Specifically, as shown in FIGS. 4 and 5, the second resetting sub-circuit includes an eleventh transistor M11, a gate electrode of the eleventh transistor M11 is electrically connected to the second resetting signal terminal T_RESET, a first electrode of the eleventh transistor M11 is electrically connected to the pull-up node PU, and a second electrode of the eleventh transistor M11 is electrically connected to the second voltage signal terminal VGL. When the second resetting signal applied to the second resetting signal terminal T_RESET is a high level, the eleventh transistor M11 is turned on, so as to apply a low level signal from the second voltage signal terminal VGL to the pull-up node PU, thereby to reset the pull-up node PU.

In some optional embodiments, as shown in FIGS. 4 and 5, the pull-down node driving sub-circuit 203 is further electrically connected to a third voltage signal terminal VDD2 and a second pull-down node PD2. Apart from the first connection unit 213, the first voltage-reduction unit 223 and the second connection unit 233, the pull-down node driving sub-circuit 203 further includes a third connection unit 243 corresponding to the first connection unit, a second voltage-reduction unit 223 corresponding to the first voltage-reduction unit 253 and a fourth connection unit 263 corresponding to the second connection unit 233. The pull-down node driving sub-circuit 203 is configured to, under the control of the third voltage signal terminal VDD2 and the pull-up node PU, transmit a third voltage signal from the third voltage signal terminal VDD2 to the second pull-down node PD2 via the third connection unit 243, and reduce a voltage applied to the fourth connection unit 263 via the second voltage-reduction unit 253, where the third voltage signal is of a phase reverse to the first voltage signal. In addition, the pull-down node driving sub-circuit 203 is configured to transmit the second voltage signal from the second voltage signal terminal VGL to the second pull-down node PD2 via the fourth connection unit 263 under the control of the pull-up node PU.

Through the above scheme, it is able to form pull-down node driving sub-circuit branches operated alternately based on the first voltage signal and the third voltage signal of a phase reverse to the first voltage signal via the first connection unit 213, the first voltage-reduction unit 223 and the second connection unit 233, as well as the third connection unit 243, the second voltage-reduction unit 253 and the fourth connection unit 263 corresponding to the first connection unit 213, the first voltage-reduction unit 223 and the second connection unit 233, respectively, so as to prevent the TFT in the pull-down node driving sub-circuit 203 from being in an operation state for a long time, thereby to avoid a serious drift of a threshold voltage due to the long-term operation, and prolong the service life of the shift register unit.

Specifically, similar to the first voltage-reduction unit, the second voltage-reduction unit also has two different structures, and the pull-down node driving sub-circuit 203 is different due to the different structures of the second voltage-reduction unit.

Optionally, in the embodiment shown in FIG. 4, the pull-down node driving sub-circuit 203 includes a twelfth transistor M12 as the third connection unit 243, a thirteenth transistor M13 as the second voltage-reduction unit 253 and a fourteenth transistor M14 as the fourth connection unit 263. A gate electrode and a first electrode of the twelfth transistor M12 are electrically connected to the third voltage signal terminal VDD2, and a second electrode of the twelfth transistor M12 is electrically connected to the second pull-down node PD2. A gate electrode of the thirteenth transistor M13 is electrically connected to the third voltage signal terminal VDD2, a first electrode of the thirteenth transistor M13 is electrically connected to the second pull-down node PD2, and a second electrode of the thirteenth transistor M13 is electrically connected to a first electrode of the fourteenth transistor M14. A gate electrode of the fourteenth transistor M14 is electrically connected to the pull-up node PU, and a second electrode of the fourteenth transistor M14 is electrically connected to the second voltage signal terminal VGL.

As can be appreciated by those skilled in the art, the larger a size of the transistor in the fourth connection unit 263, the better its withstand-voltage performance of drain and source electrodes. That is, the larger a size (such as a width of a channel) of the fourteenth transistor M14, the better the withstand-voltage performance of drain and source electrodes of M14. In the embodiment shown in FIG. 4, since the second voltage-reduction unit 253 is used to reduce the voltage applied to the fourth connection unit 263 through the voltage division, the larger a size of the thirteen transistor M13 in the second voltage-reduction unit, the more apparent the voltage-division effect, and the better the effect of reducing the voltage applied to the fourteenth transistor M14 in the fourth connection unit 263. In some embodiments, a ratio of a width of a channel of the fourteen transistor M14 to a width of a channel of the twelfth transistor M12 is greater than 7:1, and a ratio of a width of a channel of the thirteen transistor M13 to the width of the channel of the twelfth transistor M12 is greater than 20:1. In some embodiments, a ratio of the width of the channel of the twelfth transistor M12 to the width of the channel of the thirteen transistor M13 to the width of the channel of the fourteen transistor M14 is 1:(19-21):(5-7). Optionally, a ratio of the width of the channel of the twelfth transistor M12 to the width of the channel of the thirteen transistor M13 to the width of the channel of the fourteen transistor M14 is 1:20:7, so as to ensure a low level amplitude of the second pull-down node PD2.

Structures of the first connection unit 213, the first voltage-reduction unit 223 and the second connection unit 233 are similar to those mentioned hereinabove, which will not be particularly defined herein.

Through the above scheme, during a period when the third voltage signal of the third voltage signal terminal VDD2 is a high level, the third voltage signal input from the third voltage signal terminal VDD2 is applied to the second voltage-reduction unit 253 and the fourth connection unit 263 after the third connection unit 243, so it is able to realize a voltage division of the fourth connection unit 263 via the second voltage-reduction unit 253, that is, part of the voltage applied to the fourth connection unit 263 is applied to the second voltage-reduction unit 253, thereby reducing the voltage applied to the fourth connection unit 263. As a result, it is able to avoid the attenuation failure of the transistor in the fourth connection unit 263 due to being exposed to a long-term and large voltage, thereby to effectively improve the circuit stability of the shift register unit.

Optionally, in the embodiment shown in FIG. 5, the pull-down node driving sub-circuit 203 includes a twelfth transistor M12 as the third connection unit 243, a thirteenth transistor M13 as the second voltage-reduction unit 253 and a fourteenth transistor M14 as the fourth connection unit 263. A gate electrode and a first electrode of the twelfth transistor M12 are electrically connected to the third voltage signal terminal VDD2, and a second electrode of the twelfth transistor M12 is electrically connected to the second pull-down node PD2. A gate electrode of the thirteenth transistor M13 is electrically connected to the pull-up node PU, a first electrode of the thirteenth transistor M13 is electrically connected to the second pull-down node PD2, and a second electrode of the thirteenth transistor M13 is electrically connected to a first electrode of the fourteenth transistor M14. A gate electrode of the fourteenth transistor M14 is electrically connected to the pull-up node PU, and a second electrode of the fourteenth transistor M14 is electrically connected to the second voltage signal terminal VGL.

As can be appreciated by those skilled in the art, in the embodiment shown in FIG. 5, when the pull-up node PU is at a low level, both the thirteenth transistor M13' in the second voltage-reduction unit 253' and the fourteenth transistor M14 in the fourth connection unit 263 are turned off. The first electrode of the fourteenth transistor M14 is in a floating state, thereby reducing a source-to-drain voltage of the fourteenth transistor M14. Optionally, in order to ensure the low level amplitude of the second pull-down node PD2, a ratio of a width of a channel of the thirteenth transistor M13' to a width of a channel of the fourteenth transistor M14 is greater than 10:1.

Structures of the first connection unit 213, the first voltage-reduction unit 223' and the second connection unit 233 are similar to those mentioned hereinabove, which will not be particularly defined herein.

Through the above scheme, during a period when the third voltage signal of the third voltage signal terminal VDD2 is a high level, although the third voltage signal of the third voltage signal terminal VDD2 is always transmitted to the second pull-down node PD2 via the third connection unit 243, as long as the pull-up node PU is at a low level, the second voltage-reduction unit 253' is in an open-circuit state, so it is able to block the third voltage signal through an open circuit manner, thereby to avoid the attenuation failure of the transistor in the fourth connection unit 263 due to being exposed to a long-term and large voltage, thereby to effectively improve the circuit stability of the shift register unit.

In some optional embodiments, referring to FIG. 4 and FIG. 5, the noise-reduction sub-circuit 207 is further electrically connected to the second pull-down node PD2, and further configured to transmit the second voltage signal from the second voltage signal terminal VGL to the pull-up node PU under the control of the second pull-down node PD2. Therefore, when the third voltage signal terminal VDD2 is at a high level, it is able to perform noise reduction for the circuit while enabling the third connection unit 243, the second voltage-reduction unit 253 or 253' and the fourth connection unit 263 to operate.

Specifically, the noise reduction sub-circuit 207 further includes a fifteenth transistor M15, a gate electrode of the fifteenth transistor M15 is electrically connected to the second pull-down node PD2, a first electrode of the fifteenth transistor M15 is electrically connected to the pull-up node PU, and a second electrode of the fifteenth transistor M15 is electrically connected to the second voltage signal terminal VGL. When the second pull-down node PD2 is at a high level, it is able to set the pull-up node PU to the second voltage signal (which is a low level) via the fifteenth transistor M15, thereby to perform noise reduction for the circuit.

In some optional embodiments, as shown in FIG. 4 and FIG. 5, the output sub-circuit 205 is further electrically connected to the second pull-down node PD2, and further configured to transmit the second voltage signal from the second voltage signal terminal VGL to the first output signal terminal OUTPUT-1 under the control of the second pull-down node PD2. Therefore, when the third voltage signal terminal VDD2 is at a high level, it is able to perform noise reduction for the circuit through the second pull-down node PD2 while enabling the third connection unit 243, the second voltage-reduction unit 253 or 253' and the fourth connection unit 263 to operate.

Specifically, the output sub-circuit 205 includes a sixteenth transistor M16, a gate electrode of the sixteenth transistor M16 is electrically connected to the second pull-down node PD2, a first electrode of the sixteenth transistor M16 is electrically connected to the first output signal terminal, and a second electrode of the sixteenth transistor M16 is electrically connected to the second voltage signal terminal VGL. When the second pull-down node PD2 is at a high level, it is able to set the first output signal terminal OUTPUT-1 to the second voltage signal (which is a low level) via the sixteenth transistor M16, thereby to perform noise reduction for the output sub-circuit 205.

In some optional embodiments, as shown in FIG. 4 and FIG. 5, the cascade sub-circuit 206 is further electrically connected to the second pull-down node PD2, and further configured to transmit the second voltage signal from the second voltage signal terminal VGL to the second output signal terminal OUTPUT-2 under the control of the second pull-down node PD2. Therefore, when the third voltage signal terminal VDD2 is at a high level, it is able to perform noise reduction for the cascade sub-circuit through the second pull-down node PD2 while enabling the third connection unit 243, the second voltage-reduction unit 253 or 253' and the fourth connection unit 263 to operate.

Specifically, the cascade sub-circuit 206 includes a seventeenth transistor M17, a gate electrode of the seventeenth transistor M17 is electrically connected to the second pull-down node PD2, a first electrode of the seventeenth transistor M17 is electrically connected to the second output signal terminal OUTPUT-2, and a second electrode of the seventeenth transistor M17 is electrically connected to the second voltage signal terminal VGL. When the second pull-down node PD2 is at a high level, it is able to set the second output signal terminal OUTPUT-2 to the second voltage signal (which is a low level) via the seventeenth transistor M17, thereby to perform noise reduction for the cascade sub-circuit 206.

In some optional embodiments, as shown in FIG. 4 and FIG. 5, the pull-down node driving sub-circuit 203 is further electrically connected to the input signal terminal INPUT.

Optionally, the pull-down node driving sub-circuit 203 further includes a fifth connection unit 273 corresponding to the second connection unit 233, and is configured to transmit the second voltage signal from the second voltage signal terminal VGL to the first pull-down node PD1 via the fifth connection unit 273 under the control of the input signal terminal INPUT.

Through the above scheme, it is able to ensure that as long as a signal of the input signal terminal INPUT is a high level, the first pull-down node PD1 is set to a low level. That is because the signal of the input signal terminal INPUT is earlier than a signal of the pull-up node PU, a potential of the first pull-down node PD1 is pulled down by the signal of the input signal terminal INPUT. As a result, it is able to more accurately ensure that transistors in the noise reduction sub-circuit 207, the output sub-circuit 205 and the cascade sub-circuit 206 are not electrically connected to the second voltage signal terminal VGL, thereby ensuring the normal operation of the circuit and improving the accuracy of the output signal of the shift register unit.

Specifically, the fifth connection unit 273 is an eighteenth transistor M18, a gate electrode of the eighteenth transistor M18 is electrically connected to the input signal terminal INPUT, a first electrode of the eighteenth transistor M18 is electrically connected to the second electrode of the third transistor M3, and a second electrode of the eighteenth transistor M18 is electrically connected to the second voltage signal terminal VGL.

Optionally, the pull-down node driving sub-circuit 203 further includes a sixth connection unit 283 corresponding to the fourth connection unit 263, and is configured to transmit the second voltage signal from the second voltage signal terminal VGL to the second pull-down node PD2 via the sixth connection unit 283 under the control of the input signal terminal INPUT.

Through the above scheme, it is able to ensure that as long as the signal of the input signal terminal INPUT is a high level, the second pull-down node PD2 is set to a low level. That is because the signal of the input signal terminal INPUT is earlier than the signal of the pull-up node PU, a potential of the second pull-down node PD2 is pulled down by the signal of the input signal terminal INPUT. As a result, it is able to more accurately ensure that transistors in the noise reduction sub-circuit 207, the output sub-circuit 205 and the cascade sub-circuit 206 are not electrically connected to the second voltage signal terminal VGL, thereby ensuring the normal operation of the circuit and improving the accuracy of the output signal of the shift register unit.

Specifically, the sixth connection unit 283 is a nineteenth transistor M19, a gate electrode of the nineteenth transistor M19 is electrically connected to the input signal terminal INPUT, a first electrode of the nineteenth transistor M19 is electrically connected to the second electrode of the thirteenth transistor M13, and a second electrode of the nineteenth transistor M19 is electrically connected to the second voltage signal terminal VGL.

Figure 6:
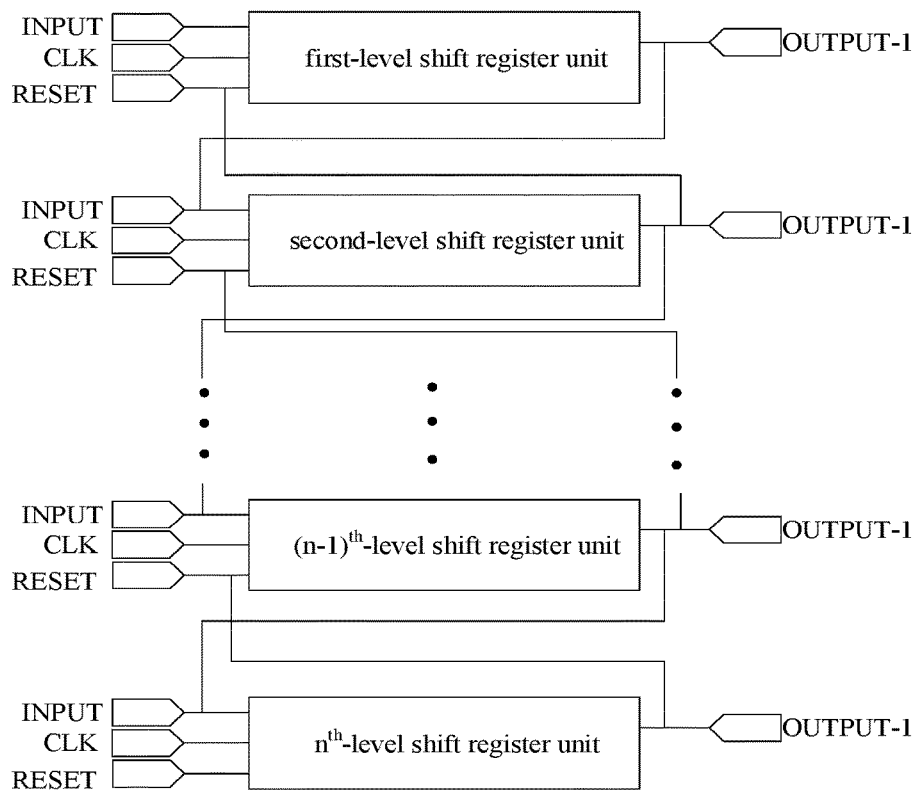
FIG. 6 is a block diagram of a gate driving circuit according to some embodiments of the present disclosure.

Based on a same inventive concept, a gate driving circuit is further provided in the present disclosure, as shown in FIG. 6, including N cascaded shift register units as described in the above-mentioned embodiments, where N is a natural number greater than 2. An input signal terminal of an $n^{th}$-level shift register unit is electrically connected to a first output signal terminal or a second output signal terminal of an $(n-1)^{th}$-level shift register unit, and a first output signal terminal or a second output signal terminal of an $(n+1)^{th}$-level shift register unit is electrically connected to a first resetting signal terminal of the $n^{th}$-level shift register unit, where n is greater than or equal to 1 and less than or equal to N. In the case that n is equal to 1, an input signal terminal of a first-level shift register unit is electrically connected to an ON signal of the gate driving circuit. In the case that n is equal to N, a first resetting signal terminal of a last-level shift register unit is electrically connected to a first resetting signal of the gate driving circuit.

In the embodiment, through the cascaded shift register units, and a voltage-reduction unit is provided in the pull-down node driving sub-circuit of each level of the shift register unit, so as to reduce the voltage applied to the second connection unit, thereby reducing a source-to-drain voltage of a transistor in the second connection unit, and avoiding the attenuation failure of the transistor. As a result, it is able to effectively improve the circuit stability of the shift register unit, thereby improving the circuit stability of the GOA manner, and provide a wide application prospect.

Based on a same inventive concept, a method for controlling the above-mentioned shift register unit is further provided in the embodiment of the present disclosure, including: at a first stage, applying a high level to the input signal terminal as an input signal, and transmitting, by the input sub-circuit, the input signal to the pull-up node, to pull up a potential of the pull-up node; pulling down, by the pull-down node driving sub-circuit, a potential of the first pull-down node under the control of the pull-up node; at a second stage, transmitting, by the output sub-circuit, a clock signal from the clock signal terminal to the first output signal terminal under the control of the pull-up node; and at a third stage, under the control of the first voltage signal terminal and the pull-up node, pulling up, by the pull-down node driving sub-circuit, the potential of the first pull-down node, and reducing a voltage applied to the second connection unit via the first voltage-reduction unit; and transmitting, by the output sub-circuit, a second voltage signal from the second voltage signal terminal to the first output signal terminal under the control of the first pull-down node.

In the embodiment, a voltage-reduction unit is provided in the pull-down node driving sub-circuit of each level of the shift register unit, so as to reduce the voltage applied to the second connection unit through controlling sequence signals of ports of the shift register unit, thereby reducing a source-to-drain voltage of a transistor in the second connection unit, and avoiding the attenuation failure of the transistor. As a result, it is able to effectively improve the circuit stability of the shift register unit, thereby improving the circuit stability of the GOA manner, and provide a wide application prospect.

Figure 7:
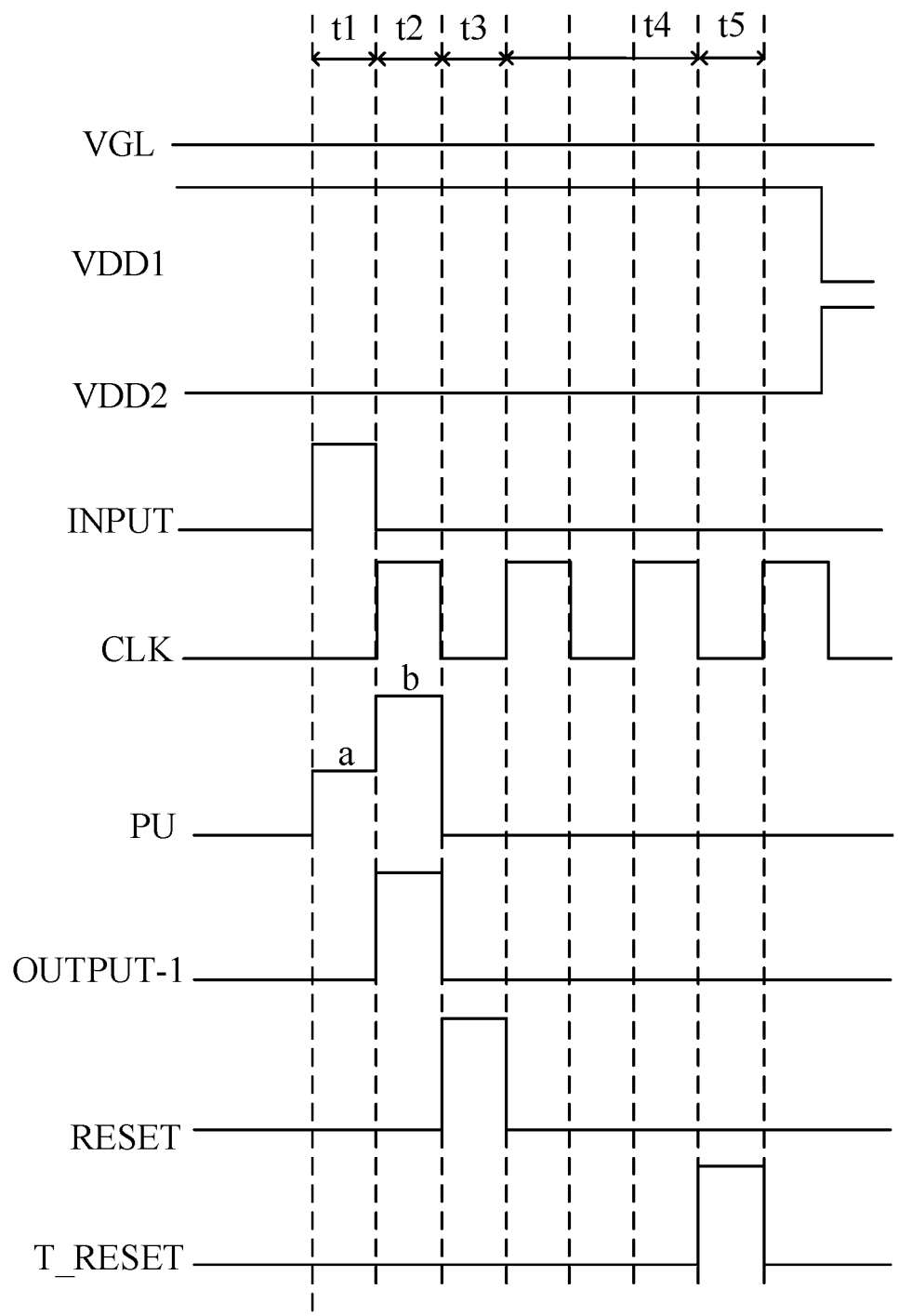
FIG. 7 is a sequence diagram of key signals for the shift register unit according to some embodiments of the present disclosure.

The above method is described in detail in combination with a sequence diagram shown in FIG. 7 and the structure shown in FIG. 4.

At the first stage, a high level is applied to the input signal terminal INPUT as an input signal, and the input sub-circuit 201 transmits the input signal to the pull-up node PU, so as to pull up a potential of the pull-up node PU. The pull-down node driving sub-circuit 203 pulls down a potential of the first pull-down node PD1 under the control of the pull-up node PU.

Specifically, at the first stage t1, the input signal is a high level, and the first transistor M1 and the eighteenth transistor M18 are turned on. The first voltage signal of the first voltage signal terminal VDD1 is a high level, and the second transistor M2 and the third transistor M3 are turned on. The pull-up node PU is charged via the first transistor M1, so as to raise the potential of the pull-up node PU to a potential a. The first pull-down node PD1 is charged via the second transistor M2. The eighteenth transistor M18 transmits the second voltage signal from the second voltage signal terminal VGL to the first pull-down node PD1, and pulls down the potential of the first pull-down node PD1 to be a low level.

When the potential of the pull-up node PU is the potential a, the fourth transistor M4 and the sixth transistor M6 are turned on. In the embodiment shown in FIG. 4, the ninth transistor M9 in the cascade sub-circuit 206 is also turned on, and output timing sequences of the ninth transistor M9 and the sixth transistor M6 are the same, which will not be particularly defined herein. The capacitor C starts to be charged, and the fourth transistor M4 transmits the second voltage signal from the second voltage signal terminal VGL to the first pull-down node PD1, so as to pull down the potential of the first pull-down node PD1. The sixth transistor M6 transmits a low-level clock signal from the clock signal terminal CLK to the first output signal terminal OUTPUT-1, and the first output signal terminal OUTPUT-1 outputs a low-level signal.

At the second stage, the output sub-circuit 205 transmits the clock signal from the clock signal terminal CLK to the first output signal terminal OUTPUT-1 under the control of the pull-up node.

Specifically, at the second stage t2, the input signal from the input signal terminal INPUT is a low level, the first transistor M1 and the eighteenth transistor M18 are turned off, the pull-up node PU is in a floating state, at this time (at the beginning of the second stage t2), the potential of the pull-up node PU is the potential a, so as to maintain the sixth transistor M6 to be in an on state. Due to the high-level clock signal of the clock signal terminal CLK and the boosting effect of the capacitor C, the potential of the pull-up node PU rises from the potential a to a potential b, the sixth transistor M6 transmits the high-level clock signal to the first output signal terminal OUTPUT-1, and the first output signal terminal OUTPUT-1 outputs a high-level signal.

The potential of the pull-up node PU is a high level, the fourth transistor M4 is maintained in an on state, and the third transistor M3 is still turned on under the effect of the first voltage signal terminal VDD1. Therefore, the fourth transistor M4 continues to pull down the potential of the first pull-down node PD1

At the third stage, under the control of the first voltage signal terminal VDD1 and the pull-up node PU, the pull-down node driving sub-circuit 203 pulls up the potential of the first pull-down node PD1, and reduces a voltage applied to the second connection unit 233 via the first voltage-reduction unit. As shown in FIG. 4, the first voltage-reduction unit is denoted as 223, and the second connection unit 233 is the fourth transistor. Under the control of the first pull-down node PD1, the noise reduction sub-circuit 207 transmits the second voltage signal from the second voltage signal terminal VGL to the pull-up node PU, so as to pull down the potential of the pull-up node PU. The output sub-circuit 205 transmits the second voltage signal from the second voltage signal terminal VGL to the first output signal terminal OUTPUT-1 under the control of the first pull-down node PD1.

At the stage t3, the first resetting signal terminal RESET-PU is at a high level, the eighth transistor M8 is turned on, so as to reset the pull-up node PU and pull down the potential of the pull-up node PU. The fourth transistor M4 and the sixth transistor M6 are turned off. The second transistor M2 is maintained to be in an on state, so as to charge the first pull-down node PD1, thereby to enable the potential of the first pull-down node PD1 to become a high level. The fifth transistor M5 and the seventh transistor M7 are turned on. The fifth transistor M5 transmits the second voltage signal of the second voltage signal terminal VGL to the pull-up node PU, and continues to pull down the potential of the pull-up node PU, so as to prevent the potential of the pull-up node PU from being adversely affected by abnormal external voltage, which enables the sixth transistor M6 to be turned on by mistake. The seventh transistor M7 is turned on, so as to transmit the second voltage signal from the second voltage signal terminal VGL to the first output signal terminal OUTPUT-1, and the first output signal terminal OUTPUT-1 outputs a low-level signal. At the stage t3, the clock signal is a low level.

At a stage t4 after the stage t3, the clock signal is switched between a high level and a low level. The fifth transistor M5 is turned on, so as to ensure that the pull-up node PU is at a low level to maintain the sixth transistor M6 to be not turned on. The first output signal terminal OUTPUT-1 outputs the low-level second voltage signal from the second voltage signal terminal VGL. This stage is also called a maintenance stage.

At a stage t5 after the stage t4, the second resetting signal from the second resetting signal terminal T_RESET is a high level, so as to control the eleventh transistor M11 to turn on. The eleventh transistor M11 transmits the second voltage signal from the second voltage signal terminal VGL to the pull-up node PU, so as to reset the pull-up node PU, thereby to prevent the potential of the pull-up node PU from being adversely affected by abnormal external voltage, which enables the sixth transistor M6 to be turned on by mistake, and prevent the first output signal from the first output signal terminal OUTPUT-1 from being abnormal.

As can be appreciated by those skilled in the art, in the above process, because the signal from the third voltage signal input terminal VDD2 is of a phase reverse to the signal from the first voltage signal terminal VDD1, the third connection unit 243, the second voltage-reduction unit 253 and the fourth connection unit 263 related to the third voltage signal input terminal VDD2 do not operate. Hence, the fifteenth transistor M15, the seventeenth transistor M17 and the sixteenth transistor M16 controlled by the signal at the second pull-down node PD2 are not turned on.

In addition, it should be appreciated that, although the sequence process is described in combination with the structure of the shift register unit shown in FIG. 4, which is not limited thereto. It is similar in other embodiments, apart from that the source-to-drain voltage(s) of the transistor(s) in the second connection unit and/or the fourth connection unit is/are reduced by means of blocking via the voltage-reduction unit(s) in FIGS. 3 and 5, which will not be particularly defined herein.

The shift register unit, the gate driving circuit, the display panel and the method for controlling the shift register unit are provided in the present disclosure, the voltage-reduction unit is provided in the pull-down node driving sub-circuit, so as to reduce the voltage applied to the second connection unit, thereby reducing the source-to-drain voltage of the transistor in the second connection circuit, and avoiding the attenuation failure of the transistor. As a result, it is able to effectively improve the circuit stability of the shift register unit, thereby improving the circuit stability of the GOA manner, and provide a wide application prospect.

Obviously, the above-mentioned embodiments of the present disclosure are for illustrative purposes only, but shall not be used to limit the scope of the present disclosure. A person skilled in the art may make further various modifications and improvements on the basis of the foregoing description, and it is not possible to list all the implementations herein. Any obvious modifications and improvements derived from the technical solutions of the present disclosure are still within the scope of the present disclosure.

What is claimed is:

1. A shift register unit, comprising:
an input sub-circuit, electrically connected to an input signal terminal and a pull-up node, and configured to transmit an input signal from the input signal terminal to the pull-up node under the control of the input signal terminal;
a pull-down node driving sub-circuit, electrically connected to a first voltage signal terminal, the pull-up node, a first pull-down node and a second voltage signal terminal, comprising a first connection unit, a first voltage-reduction unit and a second connection unit, and configured to:
under the control of the first voltage signal terminal and the pull-up node, transmit a first voltage signal from the first voltage signal terminal to the first pull-down node via the first connection unit, and reduce a voltage applied to the second connection unit via the first voltage-reduction unit; and transmit a second voltage signal from the second voltage signal terminal to the first pull-down node via the second connection unit under the control of the pull-up node; and
an output sub-circuit, electrically connected to the pull-up node, a clock signal terminal, the first pull-down node, the second voltage signal terminal and a first output signal terminal, and configured to transmit a clock signal from the clock signal terminal to the first output signal terminal under the control of the pull-up node, and transmit the second voltage signal from the second voltage signal terminal to the first output signal terminal under the control of the first pull-down node;
wherein,
the first voltage-reduction unit is configured to share the first voltage signal with the second connection unit, to reduce the voltage applied to the second connection unit under the control of the first voltage signal terminal and the pull-up node; or
the first voltage-reduction unit is configured to block the first voltage signal, to reduce the voltage applied to the second connection unit from the first voltage signal under the control of the first voltage signal terminal and the pull-up node;
wherein the pull-down node driving sub-circuit is further electrically connected to a third voltage signal terminal and a second pull-down node, and further comprises a third connection unit corresponding to the first connection unit, a second voltage-reduction unit corresponding to the first voltage-reduction unit and a fourth connection unit corresponding to the second connection unit, and the pull-down node driving sub-circuit is configured to:

under the control of the third voltage signal terminal and the pull-up node, transmit a third voltage signal from the third voltage signal terminal to the second pull-down node via the third connection unit, and reduce a voltage applied to the fourth connection unit via the second voltage-reduction unit, wherein the third voltage signal is of a phase reverse to the first voltage signal; and transmit the second voltage signal from the second voltage signal terminal to the second pull-down node via the fourth connection unit under the control of the pull-up node.

2. The shift register unit according to claim 1, wherein the pull-down node driving sub-circuit is further electrically connected to the input signal terminal;

the pull-down node driving sub-circuit further comprises a fifth connection unit corresponding to the second connection unit, and the pull-down node driving sub-circuit further comprises a sixth connection unit corresponding to the fourth connection unit;

the pull-down node driving sub-circuit is configured to transmit the second voltage signal from the second voltage signal terminal to the first pull-down node via the fifth connection unit under the control of the input signal terminal, and transmit the second voltage signal from the second voltage signal terminal to the second pull-down node via the sixth connection unit under the control of the input signal terminal.

3. The shift register unit according to claim 2, wherein the pull-down node driving sub-circuit comprises a second transistor as the first connection unit, a third transistor as the first voltage-reduction unit and a fourth transistor as the second connection unit, wherein a gate electrode and a first electrode of the second transistor are electrically connected to the first voltage signal terminal, and a second electrode of the second transistor is electrically connected to the first pull-down node;

a gate electrode of the third transistor is electrically connected to the first voltage signal terminal, a first electrode of the third transistor is electrically connected to the first pull-down node, and a second electrode of the third transistor is electrically connected to a first electrode of the fourth transistor; or, a gate electrode of the third transistor is electrically connected to the pull-up node, a first electrode of the third transistor is electrically connected to the first pull-down node, and a second electrode of the third transistor is electrically connected to a first electrode of the fourth transistor;

a gate electrode of the fourth transistor is electrically connected to the pull-up node, and a second electrode of the fourth transistor is electrically connected to the second voltage signal terminal.

4. The shift register unit according to claim 3, wherein, in the case that the gate electrode of the third transistor is electrically connected to the first voltage signal terminal, the first electrode of the third transistor is electrically connected to the first pull-down node, and the second electrode of the third transistor is electrically connected to the first electrode of the fourth transistor is electrically connected, a ratio of a width of a channel of the fourth transistor to a width of a channel of the second transistor is greater than 7:1, and a ratio of a width of a channel of the third transistor to the width of the channel of the second transistor is greater than 20:1;

wherein a ratio of the width of the channel of the second transistor to the width of the channel of the third transistor to the width of the channel of the fourth transistor is 1:(19-21):(5-7).

5. The shift register unit according to claim 3, wherein, in the case that the gate electrode of the third transistor is electrically connected to the pull-up node, the first electrode of the third transistor is electrically connected to the first pull-down node, and the second electrode of the third transistor is electrically connected to the first electrode of the fourth transistor, a ratio of a width of a channel of the third transistor to a width of a channel of the fourth transistor is greater than 10:1.

6. The shift register unit according to claim 3, wherein the pull-down node driving sub-circuit comprises a twelfth transistor as the third connection unit, a thirteenth transistor as the second voltage-reduction unit, and a fourteenth transistor as the fourth connection unit, wherein, a gate electrode and a first electrode of the twelfth transistor are electrically connected to the third voltage signal terminal, and a second electrode of the twelfth transistor is electrically connected to the second pull-down node;

a gate electrode of the thirteenth transistor is electrically connected to the third voltage signal terminal, a first electrode of the thirteenth transistor is electrically connected to the second pull-down node, and a second electrode of the thirteenth transistor is electrically connected to a first electrode of the fourteenth transistor; or, a gate electrode of the thirteenth transistor is electrically connected to the pull-up node, a first electrode of the thirteenth transistor is electrically connected to the second pull-down node, and a second electrode of the thirteenth transistor is electrically connected to a first electrode of the fourteenth transistor;

a gate electrode of the fourteenth transistor is electrically connected to the pull-up node, and a second electrode of the fourteenth transistor is electrically connected to the second voltage signal terminal.

7. The shift register unit according to claim 6, wherein, in the case that the gate electrode of the thirteenth transistor is electrically connected to the third voltage signal terminal, the first electrode of the thirteenth transistor is electrically connected to the second pull-down node, and the second electrode of the thirteenth transistor is electrically connected to the first electrode of the fourteenth transistor, a ratio of a width of a channel of the fourteen transistor to a width of a channel of the twelfth transistor is greater than 7:1, and a ratio of a width of a channel of the thirteen transistor to the width of the channel of the twelfth transistor is greater than 20:1;

wherein a ratio of the width of the channel of the twelfth transistor to the width of the channel of the thirteen transistor to the width of the channel of the fourteen transistor is 1:(19-21):(5-7).

8. The shift register unit according to claim 6, wherein, in the case that the gate electrode of the thirteenth transistor is electrically connected to the pull-up node, the first electrode of the thirteenth transistor is electrically connected to the second pull-down node, and the second electrode of the thirteenth transistor is electrically connected to the first electrode of the fourteenth transistor, a ratio of a width of a channel of the thirteenth transistor to a width of a channel of the fourteenth transistor is greater than 10:1.

9. The shift register unit according to claim 6, wherein the pull-down node driving sub-circuit further comprises an eighteenth transistor and a nineteenth transistor, a gate electrode of the eighteenth transistor is electrically connected to the input signal terminal, a first electrode of the eighteenth transistor is electrically connected to the second electrode of the third transistor, and a second electrode of the eighteenth transistor is electrically connected to the second voltage signal terminal;

a gate electrode of the nineteenth transistor is electrically connected to the input signal terminal, a first electrode of the nineteenth transistor is electrically connected to the second electrode of the thirteenth transistor, and a second electrode of the nineteenth transistor is electrically connected to the second voltage signal terminal.

10. The shift register unit according to claim 2, further comprising:

a noise-reduction sub-circuit, electrically connected to the pull-up node, the second voltage signal terminal and the first pull-down node, and configured to transmit the second voltage signal from the second voltage signal terminal to the pull-up node under the control of the first pull-down node; and a first resetting sub-circuit, electrically connected to the pull-up node, a first resetting signal terminal and the second voltage signal terminal, and configured to transmit the second voltage signal from the second voltage signal terminal to the pull-up node under the control of the first resetting signal terminal.

11. The shift register unit according to claim 10, further comprising a cascade sub-circuit, electrically connected to the pull-up node, the clock signal terminal, the first pull-down node, the second voltage signal terminal and a second output signal terminal, and configured to transmit a clock signal from the clock signal terminal to the second output signal terminal under the control of the pull-up node, and transmit the second voltage signal from the second voltage signal terminal to the second output signal terminal under the control of the first pull-down node;

wherein the shift register unit further comprises a second resetting sub-circuit, electrically connected to a second resetting signal terminal, the pull-up node and the second voltage signal terminal, and configured to transmit the second voltage signal from the second voltage signal terminal to the pull-up node under the control of the second resetting signal terminal.

12. The shift register unit according to claim 11, wherein, the noise-reduction sub-circuit is further electrically connected to the second pull-down node, and further configured to transmit the second voltage signal from the second voltage signal terminal to the pull-up node under the control of the second pull-down node;

the output sub-circuit is further electrically connected to the second pull-down node, and further configured to transmit the second voltage signal from the second voltage signal terminal to the first output signal terminal under the control of the second pull-down node;

the cascade sub-circuit is further electrically connected to the second pull-down node, and further configured to transmit the second voltage signal from the second voltage signal terminal to the second output signal terminal under the control of the second pull-down node.

13. The shift register unit according to claim 12, wherein, the input sub-circuit comprises a first transistor, a gate electrode and a first electrode of the first transistor are electrically connected to the input signal terminal, and a second electrode of the first transistor is electrically connected to the pull-up node;

the noise reduction sub-circuit comprises a fifth transistor, a gate electrode of the fifth transistor is electrically connected to the first pull-down node, a first electrode of the fifth transistor is electrically connected to the pull-up node, and a second electrode of the fifth transistor is electrically connected to the second voltage signal terminal;

the output sub-circuit comprises a sixth transistor, a seventh transistor and a capacitor, a gate electrode of the sixth transistor is electrically connected to the pull-up node, a first electrode of the sixth transistor is electrically connected to the clock signal terminal, and a second electrode of the sixth transistor is electrically connected to the first output signal terminal; a gate electrode of the seventh transistor is electrically connected to the first pull-down node, a first electrode of the seventh transistor is electrically connected to the first output signal terminal, and a second electrode of the seventh transistor is electrically connected to the second voltage signal terminal; one terminal of the capacitor is electrically connected to the gate electrode of the sixth transistor, and the other terminal of the capacitor is electrically connected to the second electrode of the sixth transistor;

the first resetting sub-circuit comprises an eighth transistor, a gate electrode of the eighth transistor is electrically connected to the first resetting signal terminal, a first electrode of the eighth transistor is electrically connected to the pull-up node, and a second electrode of the eighth transistor is electrically connected to the second voltage signal terminal.

14. The shift register unit according to claim 13, wherein, the cascade sub-circuit comprises a ninth transistor and a tenth transistor, a gate electrode of the ninth transistor is electrically connected to the pull-up node, a first electrode of the ninth transistor is electrically connected to the clock signal terminal, and a second electrode of the ninth transistor is electrically connected to the second output signal terminal; a gate electrode of the tenth transistor is electrically connected to the first pull-down node, a first electrode of the tenth transistor is electrically connected to the second output signal terminal, and a second electrode of the tenth transistor is electrically connected to the second voltage signal terminal;

the second resetting sub-circuit comprises an eleventh transistor, a gate electrode of the eleventh transistor is electrically connected to the second resetting signal terminal, a first electrode of the eleventh transistor is electrically connected to the pull-up node, and a second electrode of the eleventh transistor is electrically connected to the second voltage signal terminal.

15. The shift register unit according to claim 14, wherein, the noise reduction sub-circuit further comprises a fifteenth transistor, a gate electrode of the fifteenth transistor is electrically connected to the second pull-down node, a first electrode of the fifteenth transistor is electrically connected to the pull-up node, and a second electrode of the fifteenth transistor is electrically connected to the second voltage signal terminal;

the output sub-circuit comprises a sixteenth transistor, a gate electrode of the sixteenth transistor is electrically connected to the second pull-down node, a first electrode of the sixteenth transistor is electrically connected to the first output signal terminal, and a second electrode of the sixteenth transistor is electrically connected to the second voltage signal terminal;

the cascade sub-circuit comprises a seventeenth transistor, a gate electrode of the seventeenth transistor is electrically connected to the second pull-down node, a first electrode of the seventeenth transistor is electrically connected to the second output signal terminal, and a second electrode of the seventeenth transistor is electrically connected to the second voltage signal terminal.

16. A gate driving circuit, comprising N cascaded shift register units according to claim 1, where N is a natural number greater than 2, wherein,
- an input signal terminal of an $n^{th}$-level shift register unit is electrically connected to a first output signal terminal or a second output signal terminal of an $(n-1)^{th}$-level shift register unit, and a first output signal terminal or a second output signal terminal of an $(n+1)^{th}$-level shift register unit is electrically connected to a first resetting signal terminal of the $n^{th}$-level shift register unit, wherein n is greater than or equal to 1 and less than or equal to N;
- in the case that n is equal to 1, an input signal terminal of a first-level shift register unit is electrically connected to an ON signal of the gate driving circuit;
- in the case that n is equal to N, a first resetting signal terminal of a last-level shift register unit is electrically connected to a first resetting signal of the gate driving circuit.

17. A display panel, comprising the gate driving circuit according to claim 16.

18. A method for controlling the shift register unit according to claim 1, comprising:
- at a first stage, applying a high level to the input signal terminal as an input signal, and transmitting, by the input sub-circuit, the input signal to the pull-up node, to pull up a potential of the pull-up node; pulling down, by the pull-down node driving sub-circuit, a potential of the first pull-down node under the control of the pull-up node;
- at a second stage, transmitting, by the output sub-circuit, a clock signal from the clock signal terminal to the first output signal terminal under the control of the pull-up node; and
- at a third stage, under the control of the first voltage signal terminal and the pull-up node, pulling up, by the pull-down node driving sub-circuit, the potential of the first pull-down node, and reducing a voltage applied to the second connection unit via the first voltage-reduction unit; and transmitting, by the output sub-circuit, a second voltage signal from the second voltage signal terminal to the first output signal terminal under the control of the first pull-down node.

* * * * *